United States Patent
Kuan

(10) Patent No.: US 10,825,722 B1
(45) Date of Patent: Nov. 3, 2020

(54) METHOD OF MANUFACTURING A SEMICONDUCTOR STRUCTURE

(71) Applicant: NANYA TECHNOLOGY CORPORATION, New Taipei (TW)

(72) Inventor: Shih-Fan Kuan, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/556,174

(22) Filed: Aug. 29, 2019

(51) Int. Cl.
  *H01L 21/768* (2006.01)
  *H01L 21/311* (2006.01)
  *H01L 21/3105* (2006.01)

(52) U.S. Cl.
  CPC .... *H01L 21/7682* (2013.01); *H01L 21/31053* (2013.01); *H01L 21/31111* (2013.01)

(58) Field of Classification Search
  CPC ........... H01L 21/7682; H01L 21/31053; H01L 21/31111; H01L 29/4991; H01L 29/6656; H01L 29/6653
  See application file for complete search history.

(56) References Cited

U.S. PATENT DOCUMENTS

| 2005/0037585 A1* | 2/2005 | Park | H01L 29/4991 438/305 |
| 2018/0233398 A1* | 8/2018 | Van Cleemput | H01L 21/31122 |

* cited by examiner

*Primary Examiner* — Mohammed R Alam
(74) *Attorney, Agent, or Firm* — CKC & Partners Co., LLC

(57) ABSTRACT

A method of manufacturing a semiconductor structure includes forming a precursor structure on a substrate. The precursor structure includes a first conductive structure, a first spacer layer, and a spacer oxide layer sequentially on the substrate. The spacer oxide layer exposes a top surface of the first spacer layer. The spacer oxide layer is then recessed. A second spacer layer is formed to cover the spacer oxide layer and the first spacer layer. A portion of the second spacer layer and a portion of the spacer oxide layer are then etched to expose the lateral portion of the first spacer layer. The remaining spacer oxide layer is etched to form an air gap between the first spacer layer and the second spacer layer. A third spacer layer is formed on the lateral portion of the first spacer layer to seal the air gap.

10 Claims, 6 Drawing Sheets

METHOD OF MANUFACTURING A SEMICONDUCTOR STRUCTURE

BACKGROUND

Field of Invention

The present invention relates to a method of manufacturing a semiconductor structure. More particularly, the present invention relates to a method of manufacturing a semiconductor structure having an air gap.

Description of Related Art

A parasitic capacitance exists between two adjacent conductive structures because of their proximity to each other. For example, in a Dynamic Random Access Memory (DRAM), a bit line is easy to have parasitic capacitance with other conductive structures such as contact, metal line (e.g. word line) and related conductor (e.g. DRAM capacitor), which will make worse RC delay or make DRAM sensing amplify signal not enough.

With high integration of the semiconductor device, a distance between the conductive structures has gradually decreased. Therefore, a parasitic capacitance between the conductive structures is increased. Accordingly, there is a demand for a novel method for reducing the parasitic capacitance.

SUMMARY

In accordance with an aspect of the present invention, a method of manufacturing a semiconductor structure is provided. The method includes following operations. A precursor structure is formed on a substrate. The precursor structure includes a first conductive structure, a first spacer layer, and a spacer oxide layer. The first conductive structure is on the substrate. The first spacer layer covers the first conductive structure and has a lateral portion extending along the substrate. The spacer oxide layer is on the first spacer layer and exposes a top surface of the first spacer layer. The spacer oxide layer is recessed. A second spacer layer is formed to cover the spacer oxide layer and the first spacer layer. A portion of the second spacer layer and a portion of the spacer oxide layer are etched to expose the lateral portion of the first spacer layer. The remaining spacer oxide layer is etched to form an air gap between the first spacer layer and the second spacer layer. A third spacer layer is formed on the lateral portion of the first spacer layer to seal the air gap.

According to some embodiments of the present invention, forming the precursor structure includes following operations: forming a first spacer layer on the first conductive structure; forming a spacer oxide material layer on the first spacer layer; forming a photoresist layer on the spacer oxide material layer; and performing a planarizing process to expose the top surface of the first spacer layer.

According to some embodiments of the present invention, the first spacer layer, the second spacer layer and the third spacer layer includes nitride.

According to some embodiments of the present invention, the spacer oxide layer includes doped oxide.

According to some embodiments of the present invention, the spacer oxide layer has an etching selectivity higher than the first spacer layer and the second spacer layer.

According to some embodiments of the present invention, a top surface of the spacer oxide layer is flush with the top surface of the first spacer layer.

According to some embodiments of the present invention, recessing the spacer oxide layer includes etching the spacer oxide layer of about $\frac{1}{10}$-$\frac{2}{3}$.

According to some embodiments of the present invention, etching the remaining spacer oxide layer includes using an etchant including hydrofluoric (HF) acid to etch from a bottom of the remaining spacer oxide layer.

According to some embodiments of the present invention, the air gap has a thickness of about 1-20 nm.

According to some embodiments of the present invention, the semiconductor structure further includes a second conductive structure adjacent to the first conductive structure, wherein the second conductive structure is separated from the first conductive structure by the air gap.

It is to be understood that both the foregoing general description and the following detailed description are by examples, and are intended to provide further explanation of the invention as claimed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

In order to make the description of the present disclosure more detailed and complete, the following illustratively describes implementation aspects and specific embodiments of the present disclosure; however, this is not the only form in which the specific embodiments of the present disclosure are implemented or utilized. The embodiments disclosed below may be combined with or substituted by each other in an advantageous manner, and other embodiments may be added to an embodiment without further recording or description. In the following description, numerous specific details will be described in detail to enable readers to fully understand the following embodiments. However, the embodiments of the present disclosure may be practiced without these specific details.

Figure 1:
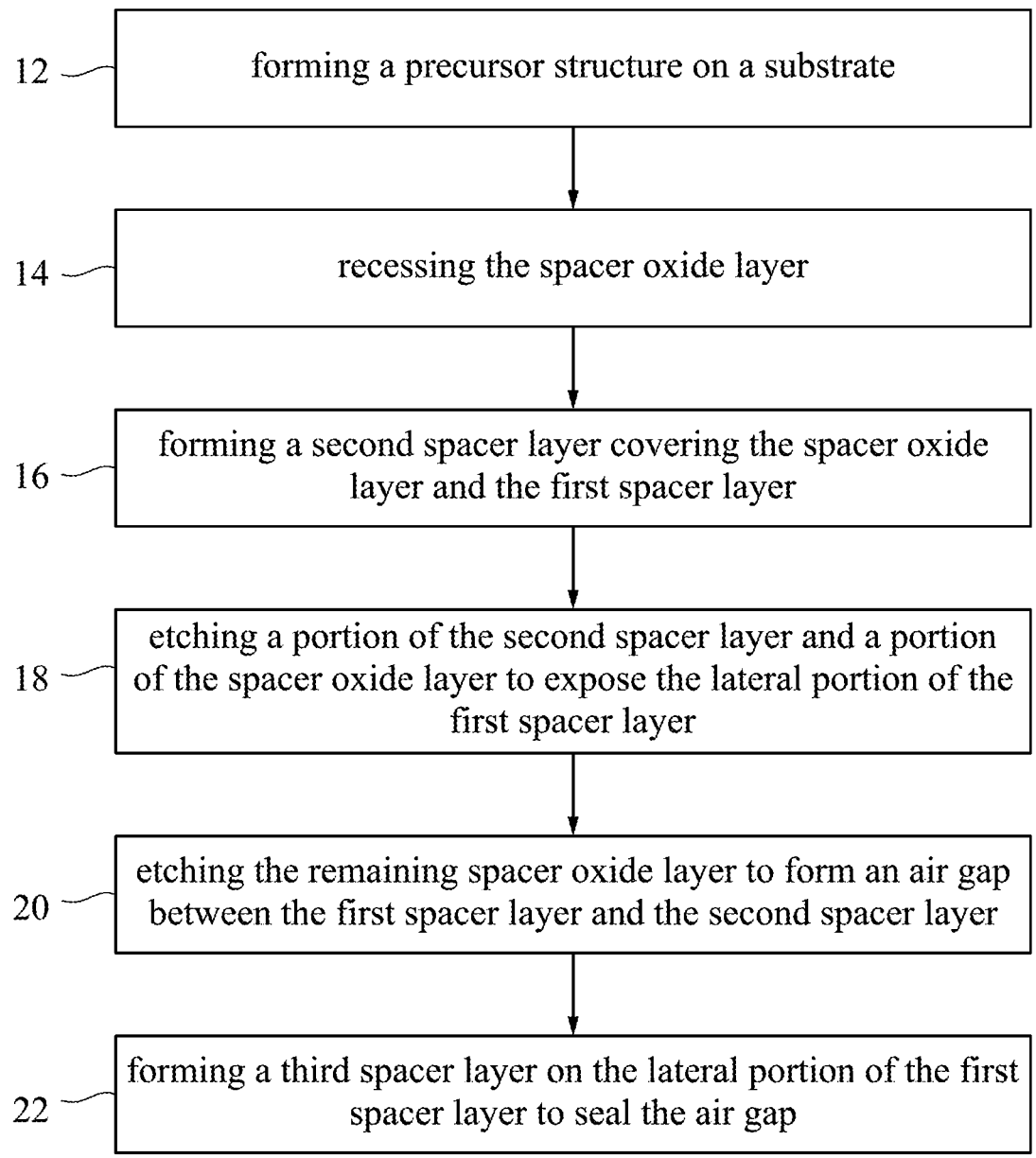
FIG. 1 is a flow chart illustrating a method of manufacturing a semiconductor structure in accordance with some embodiments of this invention.

Although below using a series of actions or steps described in this method disclosed, but the order of these actions or steps shown should not be construed to limit the present invention. For example, certain actions or steps may be performed in different orders and/or concurrently with other steps. Moreover, not all steps must be performed in order to achieve the depicted embodiment of the present invention. Furthermore, each operation or procedure described herein may contain several sub-steps or actions FIG. 1 is a flow chart illustrating a method of manufacturing a semiconductor structure in accordance with some embodiments of this invention. As shown in FIG. 1, the method 10 includes operation 12, operation 14, operation 16, operation 18, operation 20, and operation 22. FIGS. 2-11 are cross-sectional views at various stages of method 10 according to some embodiments of the present disclosure.

Please refer to FIG. 1, in the operation 12 of the method 10, a precursor structure is formed on a substrate. FIGS. 2-6 illustrate the detail steps of implementing operation 12 in accordance with an embodiment of the present disclosure.

Figure 2:
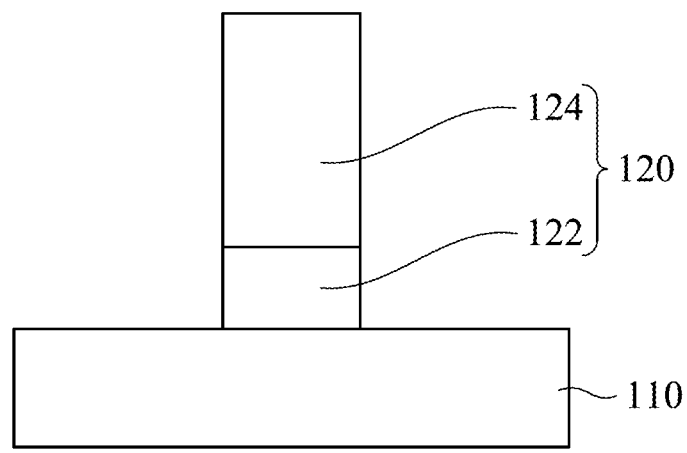
FIG. 2 to FIG. 11 are cross-sectional views of various intermediary stages in the manufacturing of semiconductor structure in accordance with some embodiments of this invention.

Please refer to FIG. 2, a first conductive structure 120 is formed on the substrate 110. In some embodiments, the substrate 110 may be semiconductor substrate, such as a silicon substrate, a silicon germanium substrate, a silicon carbon substrate, an III-V compound semiconductor substrate, or the like. In some embodiments, the substrate 110 may include one or more active device (not shown) such as transistor.

As shown in FIG. 2, the first conductive structure 120 may include a conductive layer 122 and a hard mask layer 124 stacked on the conductive layer 122. In some embodiments, the conductive layer 122 includes conductive material such as metal, metal alloy, metal nitride, or the like. In some examples, the conductive layer 122 may include tungsten. In some embodiments, the hard mask layer 124 may include nitride. In some examples, the hard mask layer 124 may be silicon nitride. The conductive structure 120 may be formed by suitable deposition and patterning process.

Figure 3:
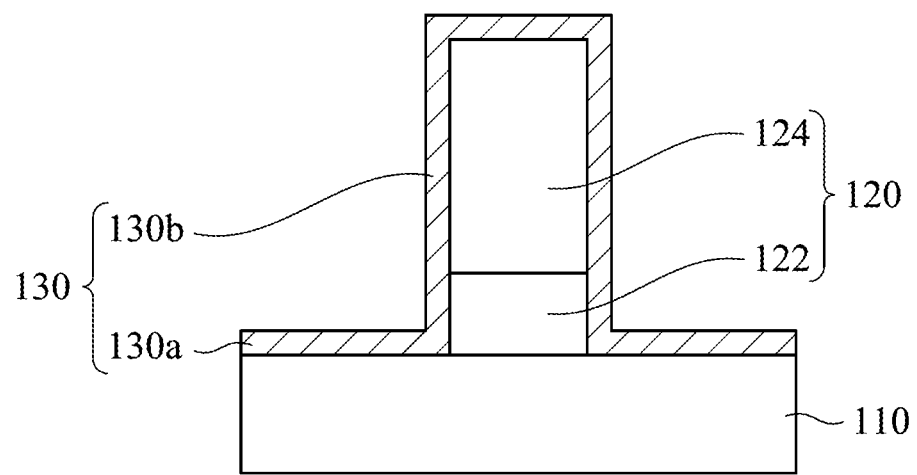

Please refer to FIG. 3, a first spacer layer 130 is formed on the first conductive structure 120. As shown in FIG. 3, the first spacer layer 130 is conformally formed on the first conductive structure 120. The first spacer layer 130 includes a lateral portion 130a and a vertical portion 130b. The vertical portion 130b is formed on a sidewall of the first conductive structure 120. The lateral portion 130a extends along the substrate 110 from a bottom of the vertical portion 130b. In some embodiments, the first spacer layer 130 may include nitride. In some examples, the first spacer layer 130 may include silicon nitride, but is not limited thereto.

Figure 4:
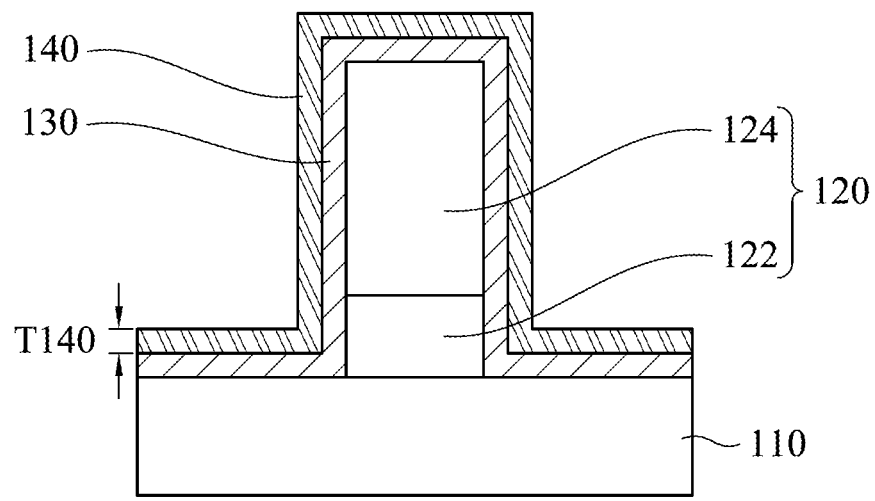

Please refer to FIG. 4, a spacer oxide material layer 140 is formed on the first spacer layer 130. In some embodiments, the spacer oxide material layer 140 may be formed by any suitable deposition method. As shown in FIG. 4, the spacer oxide material layer 140 is conformally formed on the first spacer layer 130. In some embodiments, the spacer oxide material layer 140 includes doped oxide. In some examples, the spacer oxide material layer 140 may be oxide doped with at least one of boron and phosphor. For example, the spacer oxide material layer 140 may be BP, BSG, PSG, BPSG, or the like, but is not limited thereto. In some embodiments, the spacer oxide material layer 140 has an etching selectivity higher than the first spacer layer 130. In some embodiments, the spacer oxide material layer 140 has a thickness T140 of about 1-20 nm. For example, the thickness T140 may be 2, 3, 4, 5, 10, 12, 15, 18, or 19 nm. The spacer oxide material layer 140 is removed to form an air gap (shown in FIG. 10) in the subsequent operation, such that the thickness T140 of the spacer oxide material layer 140 may be substantially equal to a thickness of the air gap. Therefore, the thickness T140 of the spacer oxide material layer 140 can be selected depending on the desired thickness of the air gap.

Figure 5:
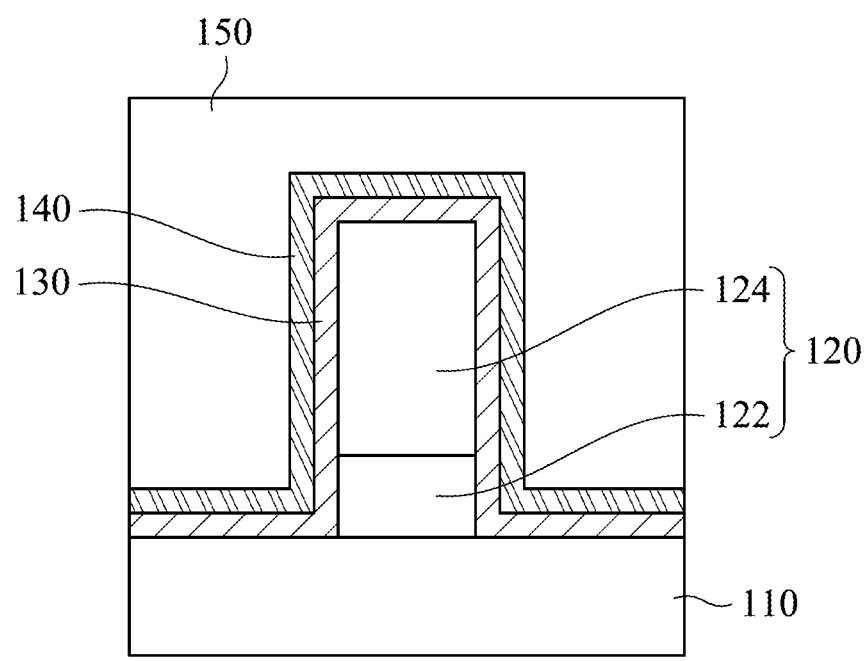

Please refer to FIG. 5, a photoresist layer 150 is formed on the spacer oxide material layer 140. The photoresist layer 150 may be coated on and cover the entire spacer oxide material layer 140.

Figure 6:
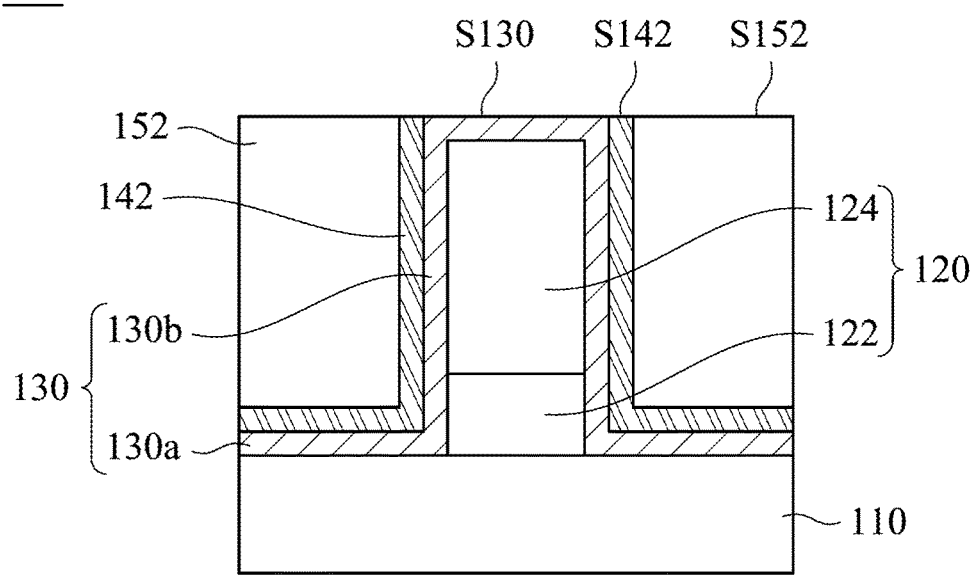

Please refer to FIG. 6, a planarizing process is performed to expose a top surface S130 of the first spacer layer 130. A portion of the photoresist layer 150 and a portion of the spacer oxide material layer 140 may be removed by a chemical mechanical polishing (CMP) process or an etching process. The top surface S130 of the first spacer layer 130 is therefore exposed by the spacer oxide layer 142 and the photoresist layer 152.

After the planarizing process, the precursor structure 101 is formed. As shown in FIG. 6, the precursor structure 101 includes the substrate 110, the first conductive structure 120, the first spacer layer 130, the spacer oxide layer 142, and the photoresist layer 152. The first conductive structure 120 is on the substrate 110. The first spacer layer 130 covers the first conductive structure 120, and has a lateral portion 130a extending along a top surface of the substrate 110. The spacer oxide layer 142 is on the first spacer layer 130 and exposes the top surface S130 of the first spacer layer 130. The top surface S142 of the spacer oxide layer 142 may be flush with the top surface S130 of the first spacer layer 130 and the top surface S152 of the photoresist layer 152.

Figure 7:
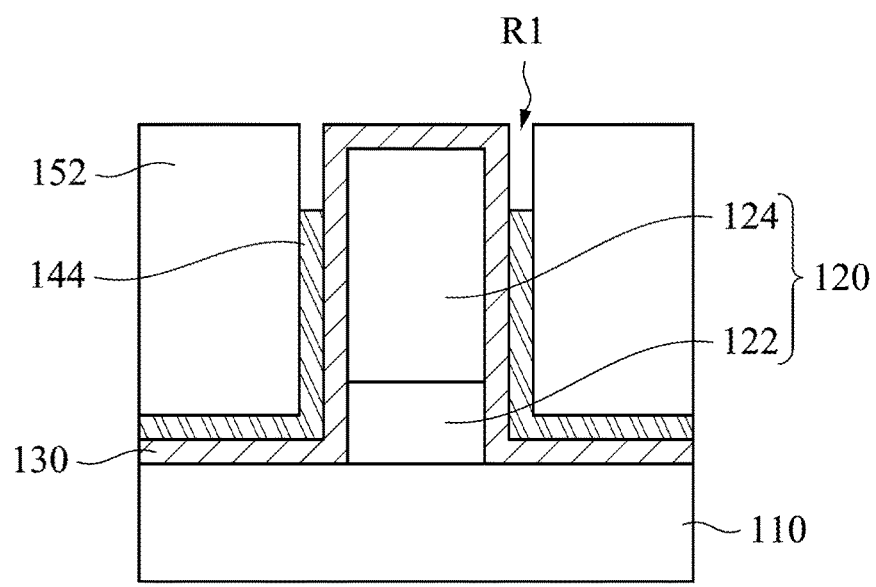

Next, please refer to FIG. 1 and FIG. 7, in the operation 14 of the method 10, the spacer oxide layer 142 is recessed. In some embodiments, the spacer oxide layer 142 is recessed by selectively etching the spacer oxide layer 142 from the top surface S142. As shown in FIG. 7, a recess R1 surrounds the conductive structure 120 and a recessed spacer oxide layer 144 are formed. In some embodiments, the spacer oxide layer 142 may be etched of about 1/10-2/3. That is, the recess R1 may have a height of about 1/10-2/3 of a height of the spacer oxide layer 142 shown in FIG. 6.

Figure 8:
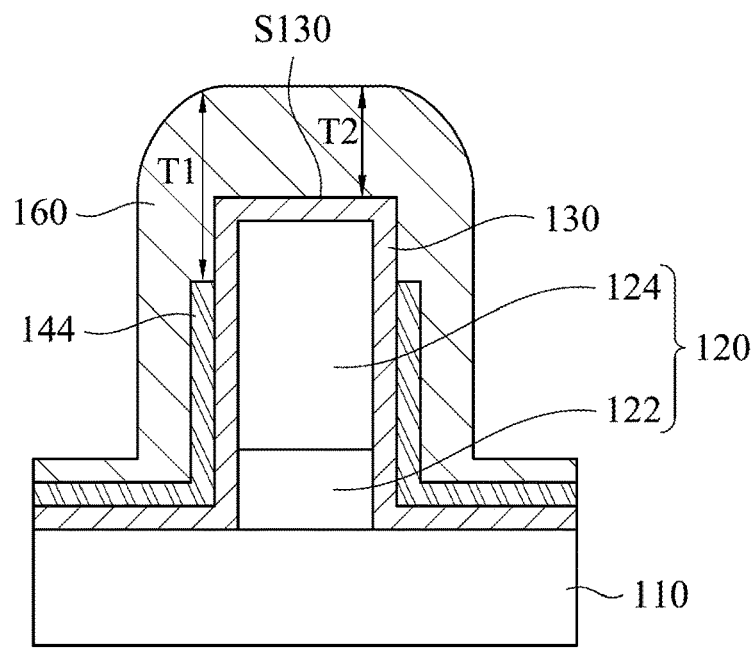

Next, referring to FIG. 1 and FIG. 8, in the operation 16 of the method 10, a second spacer layer 160 is formed to cover the recessed spacer oxide layer 144 and the first spacer layer 130. The photoresist layer 152 shown in FIG. 7 is stripped before the formation of the second spacer layer 160. In some embodiments, the second spacer layer 160 includes nitride. For example, the second spacer layer 160 may be silicon nitride. In some embodiments, the second spacer layer 160 has an etching selectivity that is different from the recessed spacer oxide layer 144. As shown in FIG. 8, the second spacer layer 160 is conformally formed on the recessed spacer oxide layer 144 and the first spacer layer 130. The recessed spacer oxide layer 144 has a top surface lower than the top surface S130 of the first spacer layer 130, such that a thickness T1 of the second spacer layer 160 on the recessed spacer oxide layer 144 is thicker than a thickness T2 of the second spacer layer 160 on the first spacer layer 130. The thicker second spacer layer 160 on the recessed spacer oxide layer 144 may protect an air gap inherited from the recessed spacer oxide layer 144 in the subsequent operation from damage and short during the following processes such as forming a second conductive structure (not shown) adjacent to the first conductive structure 120.

Figure 9:
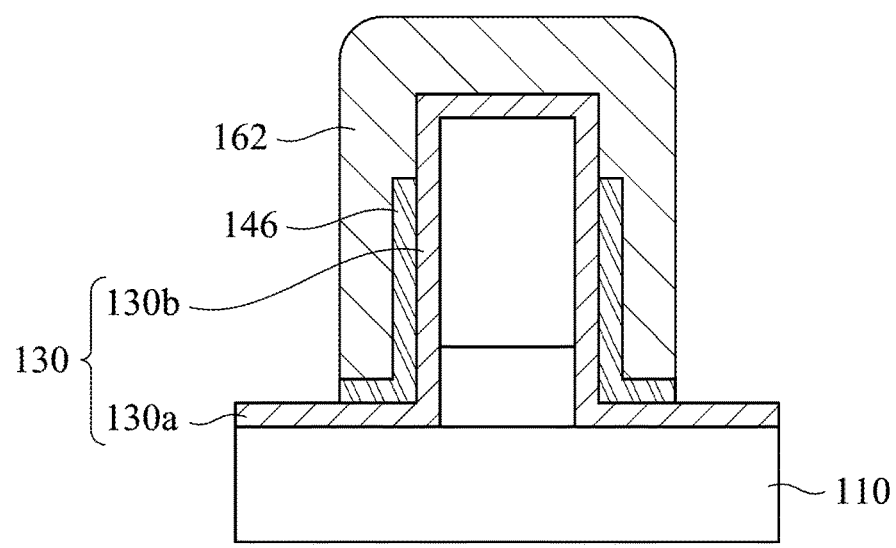

Next, referring to FIG. 1 and FIG. 9, in the operation 18 of the method 10, a portion of the second spacer layer 160 and a portion of the recessed spacer oxide layer 144 are etched to expose the lateral portion 130a of the first spacer layer 130. Specifically, the second spacer layer 160 is etched to form a second spacer layer 162, and a portion of the recessed spacer oxide layer 144 extending on the lateral portion 130a of the first spacer layer 130 is further etched to form a remaining spacer oxide layer 146, as illustrated in FIG. 9. The etching process may be stop on the lateral portion 130a of the first spacer layer 130. Therefore, the second spacer layer 162 is formed over the remaining spacer oxide layer 146, and a bottom of the remaining spacer oxide layer 146 is exposed.

Figure 10:
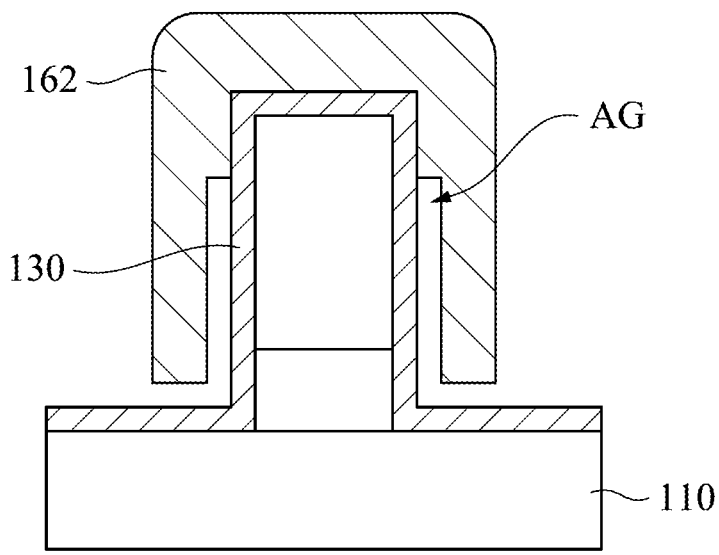

Next, referring to FIG. 1 and FIG. 10, in the operation 20 of the method 10, the remaining spacer oxide layer 146 is etched to form an air gap AG between the first spacer layer 130 and the second spacer layer 162. In some embodiments, the air gap is formed by performing a wet etching process. In some embodiments, etching the remaining spacer oxide layer 146 includes using an etchant including hydrofluoric (HF) acid to etch from the bottom of the remaining spacer oxide layer 146. Because the etching selectivity of the remaining spacer oxide layer 146 is different from the first spacer layer 130 and the second spacer layer 162, the remaining spacer oxide layer 146 is selectively removed to form the air gap AG. In some embodiments, the air gap AG has a thickness of about 1-20 nm. Specifically, the thickness of the air gap AG may be substantially equal to the thickness T140 of the spacer oxide layer 140 shown in FIG. 4.

Figure 11:
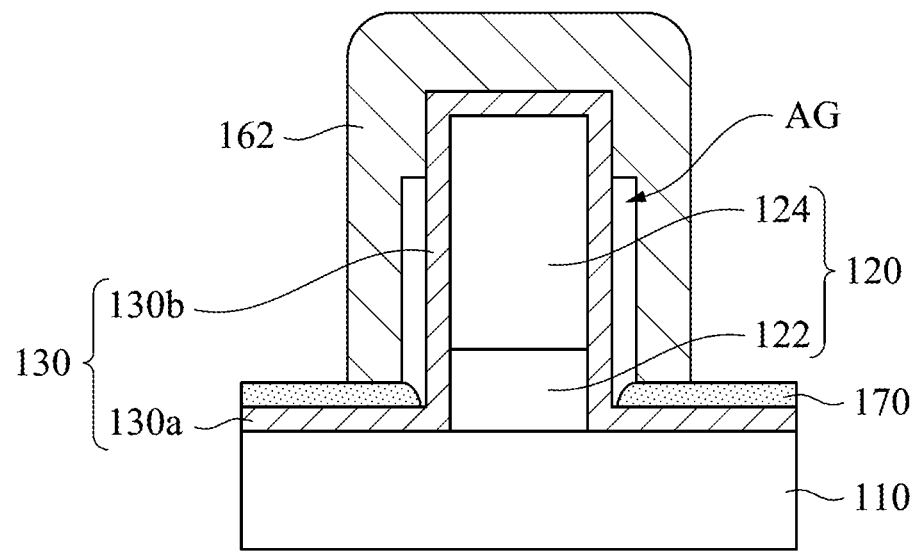

Next, referring to FIG. 1 and FIG. 11, in the operation 22 of the method 10, a third spacer layer 170 is formed on the lateral portion 130a of the first spacer layer 130 to seal the air gap AG. In some embodiments, the third spacer layer 170 includes nitride, but is not limited thereto. In some examples, the first spacer layer 130, the second spacer layer 162 and the third spacer layer 170 may include same material. It is understood that a shape of the third spacer layer 170 is not limited to FIG. 11, the third spacer layer 170 may be formed in any shape to seal the air gap AG. The air gap AG can separate and electrically insulate the first conductive structure 120 and other conductive structures (not shown) adjacent thereto, such that the parasitic capacitance between thereof can be reduced. For example, the first conductive structure 120 may be a bit line of DRAM, other conductive structure may be a contact, a word line, or the like conductive structures.

According to the embodiments of the present disclosure, a method of manufacturing a semiconductor structure is provided. The method disclosed herein forming an air gap to separate and electrically insulate the adjacent conductive structures, such that a parasitic capacitance between the adjacent conductive structures can be reduced. The air gap of the present disclosure is formed by selectively etching a spacer oxide layer between spacer layers having etching selectivity different from the spacer oxide layer. Further, the spacer oxide layer is etched from its bottom rather than from its top. Compared with the current method which etching a sacrificial layer from its top to form an air gap, the method of present disclosure is unnecessary to form another capping layer to cover a facing up opening.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A method of manufacturing a semiconductor structure, comprising: forming a precursor structure on a substrate, wherein the precursor structure comprises: a first conductive structure on the substrate; a first spacer layer covering the first conductive structure, wherein the first spacer layer has a lateral portion extending along the substrate; and a spacer oxide layer on the first spacer layer and exposing a top surface of the first spacer layer; recessing the spacer oxide layer; after recessing the spacer oxide layer, forming a second spacer layer covering the spacer oxide layer and the first spacer layer; etching a portion of the second spacer layer and a portion of the spacer oxide layer to expose the lateral portion of the first spacer layer; etching the remaining spacer oxide layer to form an air gap between the first spacer layer and the second spacer layer; and forming a third spacer layer on the lateral portion of the first spacer layer to seal the air gap.

2. The method of claim 1, wherein forming the precursor structure further comprises: forming a spacer oxide material layer on the first spacer layer; after forming the spacer oxide material layer, forming a photoresist layer on the spacer oxide material layer; and performing a planarizing process to expose the top surface of the first spacer layer to thereby form the spacer oxide layer.

3. The method of claim 1, wherein the first spacer layer, the second spacer layer and the third spacer layer comprises nitride.

4. The method of claim 1, wherein the spacer oxide layer comprises doped oxide.

5. The method of claim 1, wherein the spacer oxide layer has an etching selectivity higher than the first spacer layer and the second spacer layer.

6. The method of claim 1, wherein a top surface of the spacer oxide layer is flush with the top surface of the first spacer layer.

7. The method of claim 1, wherein recessing the spacer oxide layer comprises etching the spacer oxide layer of about $\frac{1}{10}$-$\frac{2}{3}$.

8. The method of claim 1, wherein etching the remaining spacer oxide layer comprises using an etchant comprising hydrofluoric (HF) acid to etch from a bottom of the remaining spacer oxide layer.

9. The method of claim 1, wherein the air gap has a thickness of about 1-20 nm.

10. The method of claim 1, further comprising a second conductive structure adjacent to the first conductive structure, wherein the second conductive structure is separated from the first conductive structure by the air gap.

* * * * *